(12) United States Patent
Higuchi et al.

(10) Patent No.: US 12,482,667 B2
(45) Date of Patent: Nov. 25, 2025

(54) THERMAL ETCHING OF RUTHENIUM

(71) Applicant: Tokyo Electron Limited, Tokyo (JP)

(72) Inventors: Hisashi Higuchi, Nirasaki (JP); Kai-Hung Yu, Albany, NY (US); Cory Wajda, Albany, NY (US); Gyanaranjan Pattanaik, Albany, NY (US); Kandabara Tapily, Albany, NY (US); Gerrit Leusink, Albany, NY (US); Robert Clark, Leuven (BE)

(73) Assignee: Tokyo Electron Limited, Tokyo (JP)

( * ) Notice: Subject to any disclaimer, the term of this patent is extended or adjusted under 35 U.S.C. 154(b) by 288 days.

(21) Appl. No.: 18/385,522

(22) Filed: Oct. 31, 2023

(65) Prior Publication Data
US 2024/0153781 A1    May 9, 2024

Related U.S. Application Data

(60) Provisional application No. 63/423,761, filed on Nov. 8, 2022.

(51) Int. Cl.
*H01L 21/32* (2006.01)
*H01L 21/02* (2006.01)
(Continued)

(52) U.S. Cl.
CPC .. *H01L 21/32136* (2013.01); *H01L 21/02175* (2013.01); *H01L 21/02244* (2013.01);
(Continued)

(58) Field of Classification Search
CPC ......... H01L 21/32136; H01L 21/02175; H01L 21/02244; H01L 21/02252;
(Continued)

(56) References Cited

U.S. PATENT DOCUMENTS 5,236,550 A    8/1993 Abl et al.
9,293,319 B2 *    3/2016 Dolan ............... H01L 21/02071
(Continued)

FOREIGN PATENT DOCUMENTS

TW    1650812    2/2019
WO    2017099718    6/2017

OTHER PUBLICATIONS

Yunogami et al., "Anisotropic Etching Of RuO2 And Ru With High Aspect Ratio For Gigabit Dynamic Random Access Memory", J. Vac. Sci. Technol. B, vol. 18, No. 4, Jul./Aug. 2000, 4 pgs.
(Continued)

*Primary Examiner* — Duy Vu N Deo
(74) *Attorney, Agent, or Firm* — Egan, Enders & Huston LLP.

(57) ABSTRACT

Embodiments of methods are provided for thermal dry etching of a ruthenium (Ru) metal layer. In the disclosed embodiments, a substrate containing a Ru metal layer formed thereon is exposed to a gas pulse sequence, while the substrate is held at a relatively high substrate temperature (e.g., a temperature greater than or equal to about 160° C.), to provide thermal etching of the Ru metal layer. As described further herein, the gas pulse sequence may generally include a plurality of gas pulses, which are supplied to the substrate sequentially with substantially no overlap between gas pulses. The gas pulses supplied to the substrate form: (i) volatile reaction products that are vaporized from the Ru surface, and (ii) non-volatile oxide surface layers that are removed from the Ru surface by the next gas pulse, resulting in atomic layer etching (ALE) of the Ru metal layer.

20 Claims, 11 Drawing Sheets

(51) Int. Cl.
*H01L 21/311* (2006.01)
*H01L 21/3213* (2006.01)

(52) U.S. Cl.
CPC .. *H01L 21/02252* (2013.01); *H01L 21/02337* (2013.01); *H01L 21/31122* (2013.01)

(58) Field of Classification Search
CPC ......... H01L 21/02337; H01L 21/31122; H01L 21/02192; H01L 21/32135
USPC ........................................................ 438/706
See application file for complete search history.

(56) References Cited

U.S. PATENT DOCUMENTS

| | | |
|---|---|---|
| 11,802,342 B2 | 10/2023 | Abel |
| 2018/0223437 A1 | 8/2018 | George et al. |
| 2019/0295856 A1* | 9/2019 | Tahara .............. H01J 37/32724 |
| 2020/0312673 A1 | 10/2020 | Tsai et al. |
| 2022/0254683 A1* | 8/2022 | Zandi ................ H01L 21/76865 |
| 2022/0285163 A1 | 9/2022 | Clark |
| 2022/0301887 A1 | 9/2022 | Kazem et al. |
| 2022/0392752 A1* | 12/2022 | Lin ................... H01J 37/32467 |
| 2023/0121246 A1 | 4/2023 | Abel |

OTHER PUBLICATIONS

Transmittal Of The International Search Report And The Written Opinion, Application No. PCT/US2023/036406, Filing Date Oct. 31, 2023, 11 pgs.

* cited by examiner

| | As-deposited Ru | O₃ | O₃/HF | O₃/BCl₃/HF |
|---|---|---|---|---|
| AFM Images | | | | |
| Rq (nm) | 1.5 | 31.5 | 26.3 | 1.8 |
| Ra (nm) | 1.2 | 25.8 | 20.8 | 1.4 |
| Rmax (nm) | 8.9 | 167.3 | 158.4 | 11.4 |

FIG. 6C

THERMAL ETCHING OF RUTHENIUM

This application claims priority to U.S. Provisional Application No. 63/423,761 entitled Thermal Etching of Ruthenium, filed Nov. 8, 2022, the disclosure of which is expressly incorporated herein by reference in its entirety.

FIELD OF THE INVENTION

The present invention relates to semiconductor processing and semiconductor devices, and more particularly, to a method for etching of a ruthenium (Ru) metal layer.

BACKGROUND

Ruthenium (Ru) metal is an excellent candidate to meet the International Technology Roadmap for Semiconductors (ITRS) resistance requirements as a copper (Cu) metal replacement at nanoscale feature sizes. Ru metal has a high melting point and low bulk resistivity and it is less affected by downward scaling of feature sizes than Cu metal. However, Ru metal is hard to dry etch in a controlled way, even using plasma etching. It is therefore desirable to develop effective Ru metal etching methods that may be used in device manufacturing.

Known dry etching methods for Ru metal include the use of ozone ($O_3$), oxygen ($O_2$) plasma, or oxygen/chlorine ($O_2$/$Cl_2$) plasma, for example. While ozone is commonly used to etch Ru metal, the etch rate and reaction by-products produced during ozone exposure are dependent on the substrate temperature. FIG. 1A illustrates the effect of substrate temperature when a Ru metal layer is exposed to ozone. As shown in FIG. 1A, exposing Ru metal to $O_3$ gas) at substrate temperatures between about 100° C. and about 160° C. results in the formation of volatile $RuO_4$ etch products, which are vaporized from the Ru surface at high etch rates, resulting in a nonstop etch of the Ru surface. However, a non-volatile ruthenium oxide ($RuO_2$) etch product is formed on the Ru metal at the onset of etching when the Ru metal is exposed to $O_3$ gas) at substrate temperatures above about 160° C. Once present on the surface of the Ru metal layer, the non-volatile $RuO_2$ etch product hinders further etching of the Ru metal layer by $O_3$.

FIG. 1B illustrates the challenges involved when etching a Ru metal layer using $O_3$ gas) at high substrate temperatures (e.g., temperatures above about 160° C.). In the example shown in FIG. 1B, a semiconductor substrate 100 is provided with a metal layer 110, an etch stop layer (ESL) 120 and an interlayer dielectric layer (ILD) 130. An opening formed through the ILD layer 130 and ESL 120 to the metal layer 110 is filled with a Ru metal layer 140. The Ru metal layer 140 is etched with $O_3$ gas) at high substrate temperature to form a Ru metal liner within the opening. However, at the onset of the etch, a $RuO_2$ etch product is formed on exposed surfaces of the Ru metal layer 140. Since $RuO_2$ cannot be etched by $O_3$, no further etching occurs with continued exposure to $O_3$.

New methods for etching ruthenium (Ru) metal are needed to overcome the challenges mentioned above. Specifically, new methods are needed for thermal dry etching of a Ru metal layer at a controllable etch rate, which provides layer by layer etching of the Ru surface.

SUMMARY

The present disclosure provides various embodiments of methods for thermal dry etching of a ruthenium (Ru) metal layer. In the embodiments disclosed herein, a substrate containing a Ru metal layer formed thereon is exposed to a gas pulse sequence, while the substrate is held at a relatively high substrate temperature (e.g., a temperature greater than or equal to about 160° C.), to provide thermal etching of the Ru metal layer. As described further herein, the gas pulse sequence generally includes a plurality of gas pulses, which are supplied to the substrate sequentially with substantially no overlap between gas pulses. The gas pulses supplied to the substrate form: (i) volatile reaction products (etch by-products) that are vaporized from the Ru surface, and (ii) non-volatile oxide surface layers that are removed from the Ru surface by the next gas pulse, resulting in atomic layer etching (ALE) of the Ru metal layer.

Various embodiments of methods are provided herein for thermal dry etching of a ruthenium (Ru) metal layer. According to a first embodiment, the method includes providing a substrate containing a ruthenium metal layer thereon, the ruthenium metal layer having a ruthenium surface exposed on the substrate, and exposing the substrate to a gas pulse sequence to etch the ruthenium metal layer. In the first embodiment of the method, exposing the substrate to the gas pulse sequence includes sequentially: a) exposing the substrate to a first gas pulse comprising an oxygen-containing gas to form a first non-volatile oxide surface layer on the ruthenium metal layer, wherein the first non-volatile oxide surface layer is not removed by the oxygen-containing gas; b) exposing the substrate to a second gas pulse comprising a chlorine-containing gas to convert the first non-volatile oxide surface layer to a second non-volatile oxide surface layer, wherein the second non-volatile oxide surface layer is not removed by the chlorine-containing gas; and c) exposing the substrate to a third gas pulse comprising a fluorine-containing gas to remove the second non-volatile oxide surface layer from the ruthenium surface and etch the ruthenium metal layer. In some embodiments, the method may further include repeating said exposing the substrate to the gas pulse sequence at least once to achieve a predetermined etch amount of the ruthenium metal layer.

A wide variety of oxygen-containing gases, chlorine-containing gases and fluorine-containing gases can be utilized within the gas pulse sequence described herein. In some embodiments, the oxygen-containing gas may comprise oxygen ($O_2$), ozone ($O_3$), water or hydrogen peroxide ($H_2O_2$). The chlorine-containing gas may comprise boron trichloride ($BCl_3$), chlorine ($Cl_2$), tungsten chloride ($WCl_5$), hydrochloric acid (HCl), trans-dichloroethylene ($C_2H_2Cl_2$), chlorine trifluoride ($ClF_3$) or titanium tetrachloride ($TiCl_4$). The fluorine-containing gas may comprise hydrogen fluoride (HF), tungsten hexafluoride ($WF_6$), chlorine trifluoride ($ClF_3$), fluorine ($F_2$), xenon difluoride ($XeF_2$), boron trifluoride ($BF_3$), carbon tetrafluoride ($CF_4$), or nitrogen trifluoride ($NF_3$).

In one example embodiment, the oxygen-containing gas comprises ozone ($O_3$), the chlorine-containing gas comprises boron trichloride ($BCl_3$) and the fluorine-containing gas comprises hydrogen fluoride (HF). When a gas pulse sequence comprising $O_3$/$BCl_3$/HF is utilized: a) exposing the substrate to the first gas pulse comprising ozone ($O_3$) may form a ruthenium oxide surface layer on the ruthenium metal layer, wherein the ruthenium oxide surface layer is non-volatile and not removed by the ozone; b) exposing the substrate to the second gas pulse comprising boron trichloride ($BCl_3$) may form a boron oxide surface layer on the ruthenium metal layer, wherein the boron oxide surface layer is non-volatile and not removed by the boron trichloride; and c) exposing the substrate to the third gas pulse comprising hydrogen fluoride (HF) may remove the boron oxide surface layer from the ruthenium surface without etching the ruthenium metal layer underlying the boron oxide surface layer. However, other combinations of oxygen-containing gases, chlorine-containing gases and fluorine-containing gases can also be utilized within the gas pulse sequence disclosed herein.

According to a second embodiment, the method includes providing a substrate containing a ruthenium metal layer thereon, the ruthenium metal layer having a ruthenium surface exposed on the substrate, and exposing the substrate to a gas pulse sequence to etch the ruthenium metal layer. In the second embodiment of the method, exposing the substrate to the gas pulse sequence includes sequentially: a) exposing the substrate to a first gas pulse comprising ozone ($O_3$) to form: (i) volatile ruthenium oxide reaction products that are removed from the ruthenium surface, and (ii) a non-volatile ruthenium oxide surface layer on the ruthenium metal layer, wherein the non-volatile ruthenium oxide surface layer is not removed by the ozone; b) exposing the substrate to a second gas pulse comprising boron trichloride ($BCl_3$) to react with the ruthenium oxide surface layer and form: (i) volatile ruthenium oxychloride reaction products that are removed from the ruthenium surface, and (ii) a non-volatile boron oxide surface layer on the ruthenium metal layer, wherein the non-volatile boron oxide surface layer is not removed by the boron trichloride; and c) exposing the substrate to a third gas pulse comprising hydrogen fluoride (HF) to remove the non-volatile boron oxide surface layer from the ruthenium surface to etch the ruthenium metal layer; and repeating the gas pulse sequence at least once to achieve a predetermined etch amount of the ruthenium metal layer.

According to a third embodiment, the method includes providing a substrate containing a ruthenium metal layer thereon, the ruthenium metal layer having a ruthenium surface exposed on the substrate, and exposing the substrate to a gas pulse sequence to etch the ruthenium metal layer. In the third embodiment of the method, a temperature of the substrate is greater than about 160° C. while exposing the substrate to the gas pulse sequence. Unlike the previous two embodiments in which the gas pulse sequence includes three gas pulses, the third embodiment includes sequential and alternating exposures of: a) exposing the substrate to a first gas pulse comprising ozone to form a non-volatile ruthenium oxide surface layer on the ruthenium metal layer, wherein the non-volatile ruthenium oxide surface layer is not removed by the ozone; and b) exposing the substrate to a second gas pulse comprising a chlorine-containing gas to remove the non-volatile oxide surface layer from the ruthenium surface and etch the ruthenium metal layer. The method may further include repeating the gas pulse sequence at least once to achieve a predetermined etch amount of the ruthenium metal layer. In the third embodiment, the chlorine-containing gas may further comprise hydrogen. For example, the chlorine-containing gas may be hydrogen chloride (HCl), chloroform ($CHCl_3$), chloromethane ($CH_3Cl$), dichloromethane ($CH_2Cl_2$) or trichloroethylene ($C_2HCl_3$).

In the various embodiments disclosed herein, the substrate is exposed to the gas pulse sequence while subjecting the substrate to relatively high temperatures. In some embodiments, the temperature of the substrate may range between about 160° C. and about 400° C., more preferably between about 200° C. and about 300° C., or between 225° C. and about 275° C. In one example embodiment, the substrate temperature may be approximately 250° C. during the sequential gas exposure. Other relatively high substrate temperatures may also be utilized in the embodiments disclosed herein.

In some embodiments, the gas exposure steps may be performed without plasma excitation, or at least without exposing the substrate to plasma. When ozone is utilized as the oxygen-containing gas, the ozone may be formed in a remote plasma source and flowed to the substrate to avoid exposing the substrate to an oxygen plasma, which may otherwise damage the substrate surface.

As noted above and described further herein, the present disclosure provides various embodiments of methods for thermal dry etching of a ruthenium metal layer. Of course, the order of discussion of the different steps as described herein has been presented for the sake of clarity. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, the summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6C are Atomic Force Microscope (AFM) images showing surface roughness results for the test structure in FIG. 4 when the test structure is etched using different etch chemistries at a substrate temperature of 250° C.

DETAILED DESCRIPTION

Figure 1A:
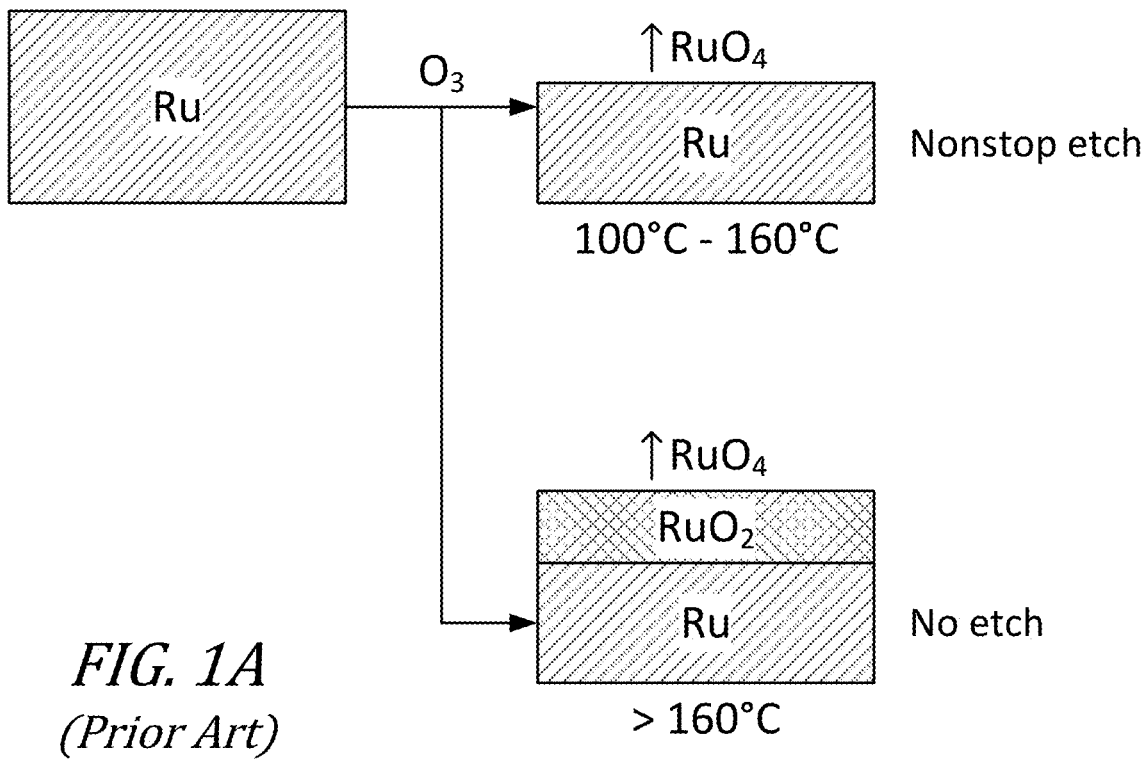
FIG. 1A (Prior Art) illustrates the effect of substrate temperature when a ruthenium (Ru) metal layer is exposed to ozone.
Figure 1B:
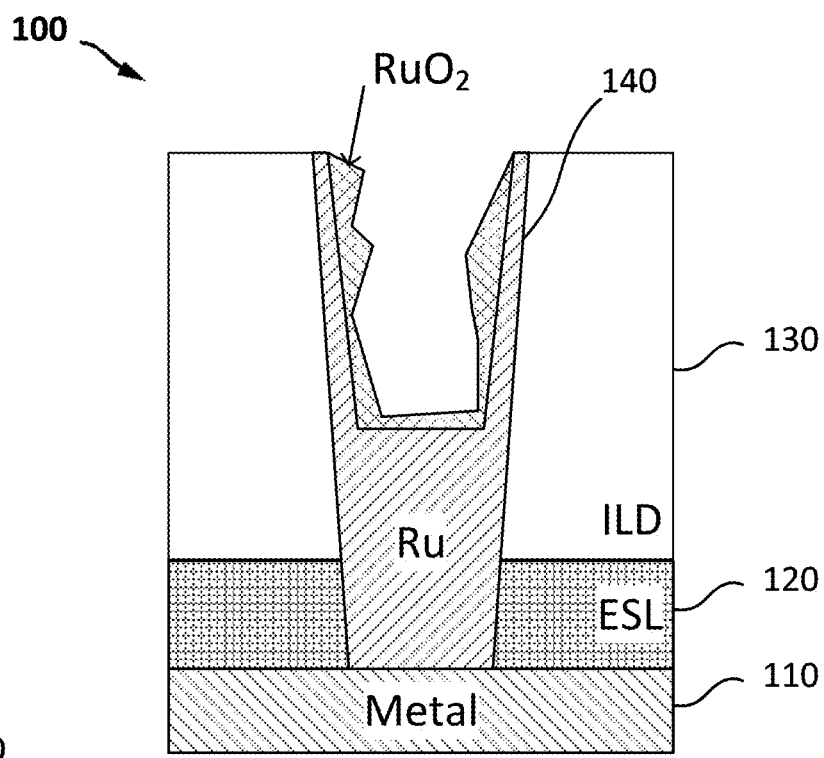
FIG. 1B (Prior Art) is a cross-sectional view of an example substrate having a Ru metal layer formed thereon, illustrating the non-volatile ruthenium oxide ($RuO_2$) reaction products formed when using ozone to etch the Ru metal layer at substrate temperatures above 160° C.

Various embodiments of methods are provided herein for thermal dry etching of a ruthenium (Ru) metal layer. In the disclosed embodiments, a substrate containing a Ru metal layer formed thereon is exposed to a gas pulse sequence, while the substrate is held at a relatively high substrate temperature (e.g., a temperature greater than or equal to about 160° C.), to provide thermal etching of the Ru metal layer. As described further herein, the gas pulse sequence may generally include a plurality of gas pulses, which are supplied to the substrate sequentially with substantially no overlap between gas pulses. The gas pulses supplied to the substrate form: (i) volatile reaction products (etch by-products) that are vaporized from the Ru surface, and (ii) non-volatile oxide surface layers that are removed from the Ru surface by the next gas pulse, resulting in atomic layer etching (ALE) of the Ru metal layer.

In some embodiments, the gas pulse sequence may include at least two gas pulses, such as a first gas pulse comprising an oxygen-containing gas and a second gas pulse comprising a chlorine-containing gas. Exposing the substrate to the oxygen-containing gas forms volatile ruthenium oxide ($RuO_4$) etch products that are vaporized from the Ru surface and a ruthenium oxide ($RuO_2$) surface layer, which is non-volatile and cannot be removed by the oxygen-containing gas. When the substrate is exposed to the second gas pulse, the chlorine-containing gas reacts with the non-volatile ruthenium oxide ($RuO_2$) surface layer to form volatile reaction products that are vaporized from the Ru surface to remove the ruthenium oxide ($RuO_2$) surface layer from the substrate.

In other embodiments, the gas pulse sequence may include at least three gas pulses, such as a first gas pulse comprising an oxygen-containing gas, a second gas pulse comprising a chlorine-containing gas and a third gas pulse comprising a fluorine-containing gas. As noted above, exposing the substrate to the oxygen-containing gas forms volatile ruthenium oxide ($RuO_4$) etch products that are vaporized from the Ru surface and a non-volatile ruthenium oxide ($RuO_2$) surface layer. When the substrate is exposed to the second gas pulse, the chlorine-containing gas reacts with the non-volatile ruthenium oxide ($RuO_2$) surface layer to form volatile ruthenium oxychloride ($RuO_xCl_y$) reaction products that are vaporized from the Ru surface and another oxide surface layer, which is non-volatile and cannot be removed by the chlorine-containing gas. When the substrate is exposed to the third gas pulse, the fluorine-containing gas removes the non-volatile oxide surface layer from the Ru surface to etch the Ru metal layer.

As described in more detail below, the embodiments disclosed herein provide methods for thermal dry etching of a Ru metal layer at a controllable etch rate by utilizing a gas pulse sequence of etch gases that provide self-limiting etch behavior during each gas pulse exposure. During exposure to the first gas pulse, an oxygen-containing gas (e.g., ozone, $O_3$) reacts with the Ru surface to form a non-volatile $RuO_2$ surface layer, which may be one or more atomic layers thick. During the second gas pulse, a chlorine-containing gas (e.g., boron trichloride, $BCl_3$) reacts with the $RuO_2$ surface layer to convert the $RuO_2$ surface layer into another non-volatile oxide surface layer (e.g., boron trioxide, $B_2O_3$). During the third gas pulse, a fluorine-containing gas (e.g., hydrogen fluoride, HF) reacts with the non-volatile oxide surface layer to remove the non-volatile oxide surface layer from the Ru surface and etch the Ru metal layer. However, the fluorine-containing gas does not react with the underlying Ru metal layer or provide further etching of the Ru surface. As such, each gas pulse sequence provides atomic layer etching (ALE) of the Ru metal layer. In some embodiments, the substrate may be repeatedly exposed to the gas pulse sequence until a predetermined etch amount of the Ru metal layer is achieved.

The thermal dry etching methods disclosed herein provide several advantages over conventional methods for etching ruthenium. For example, the thermal dry etching methods disclosed herein may be performed without plasma excitation of the etching gases. This avoids damage to the substrate surface. In addition, the thermal dry etching process is controllable at the atomic-scale, can be selective to other materials and can be performed within the same process chamber. The thermal dry etching methods also provide a smooth etched surface of the Ru metal layer, as shown and described further herein.

Figure 2:
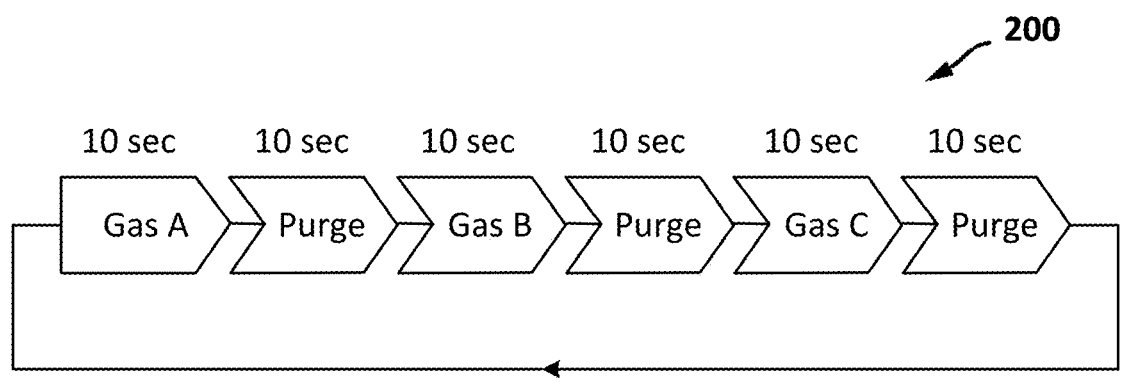
FIG. 2 illustrates an example gas pulse sequence for etching a Ru metal layer according to one embodiment of the present disclosure.

FIG. 2 illustrates an example gas pulse sequence 200 that may be used for etching a Ru metal layer provided on a semiconductor substrate, according to one embodiment of the present disclosure. In the embodiment shown in FIG. 2, the gas pulse sequence 200 uses gas pulses of three different etch gases (A, B, and C) to provide thermal dry etching of the Ru metal layer. The gas pulses of the three different etch gases (A, B, and C) are supplied to the semiconductor substrate sequentially with substantially no overlap. According to one embodiment, the semiconductor substrate may be exposed to sequential gas pulses of the three different etch gases (A, B, and C) to etch the Ru metal layer, and the process chamber used for the etching process may be purged using an inert purge gas (such as, e.g., argon (Ar)) between the sequential gas exposures. This is schematically shown in FIG. 2 for exemplary 10 sec gas exposure times for each of the etch gases (A, B and C) and the purge gas. Other gas exposure times may also be used for the etch gases and/or the purge gas. In one example, only the etch gases may be pulsed, and the purge gas may be continuously flowed during the entire etching process. As indicated by the process arrow shown in FIG. 2, the gas pulse sequence 200 may be repeated at least once to further etch the Ru metal layer and achieve a predetermined etch amount. The number of repeats is referred to as a number of cycles.

In the embodiment shown in FIG. 2, the gas pulse sequence 200 includes a first gas pulse comprising a first etch gas (A), a second gas pulse comprising a second etch gas (B) and a third gas pulse comprising a third etch gas (C). The first etch gas (A), the second etch gas (B) and the third etch gas (C) may each comprise a wide variety of etch gases. For example, the first etch gas (A) may be an oxygen-containing gas such as oxygen ($O_2$), ozone ($O_3$), water or hydrogen peroxide ($H_2O_2$), the second etch gas (B) may be a chlorine-containing gas such as boron trichloride ($BCl_3$), chlorine ($Cl_2$), tungsten chloride ($WCl_5$), hydrochloric acid (HCl), trans-dichloroethylene ($C_2H_2Cl_2$), chlorine trifluoride ($ClF_3$) or titanium tetrachloride ($TiCl_4$), and the third etch gas (C) may be a fluorine-containing gas such as hydrogen fluoride (HF), tungsten hexafluoride ($WF_6$), chlorine trifluoride ($ClF_3$), fluorine ($F_2$), xenon difluoride ($XeF_2$), boron trifluoride ($BF_3$), carbon tetrafluoride ($CF_4$), or nitrogen trifluoride ($NF_3$). In some embodiments, the third gas pulse and the last purge step may be omitted from the gas pulse sequence 200 if the second etch gas (B) includes a chlorine and hydrogen containing gas, such as hydrogen chloride (HCl), chloroform ($CHCl_3$), chloromethane ($CH_3Cl$), dichloromethane ($CH_2Cl_2$) or trichloroethylene ($C_2HCl_3$).

According to one embodiment, the methods disclosed herein may provide thermal dry etching of a Ru metal layer using sequential gas exposures of ozone ($O_3$), boron trichloride ($BCl_3$), and hydrogen fluoride (HF). Referring to FIG. 2, the gas pulse sequence 200 may include sequential gas flows of etch gases A, B and C, where gas A can be ozone ($O_3$), gas B can be boron trichloride ($BCl_3$), and gas C can be hydrogen fluoride (HF). The purge gas can include argon (Ar) or another inert gas. In one example, Ar gas may be supplied to the process chamber as a gas pulse separating the sequential gas exposures, or may be continuously flowed into the processing chamber during the sequential gas exposures. In one example, the gas pressure in the processing chamber can be about 1.0 Torr, the Ar gas flow can be about 4,000 standard cubic centimeters per minute (sccm), the HF gas flow can be about 50 sccm, the $BCl_3$ gas flow can be about 50 sccm and the $O_3$ density can be about 300 $g/m^3$.

In one example, ozone ($O_3$) may be generated by flowing oxygen ($O_2$) gas through a remote ozone generator that forms an $O_3/O_2$ mixture containing about 10% $O_3$. Thereafter, the $O_3/O_2$ mixture is flowed into the process chamber containing the substrate. The exposure to the $O_3$ gas thermally oxidizes an exposed surface of the Ru metal layer to form volatile ruthenium oxide species (including ruthenium tetroxide, $RuO_4(g)$) that desorb from the ruthenium surface, thereby etching the Ru metal nuclei layer. In one example, the $O_3$ gas) may be formed in a remote plasma system from an $O_2$ gas flow of about 1000 sccm.

Figure 3:
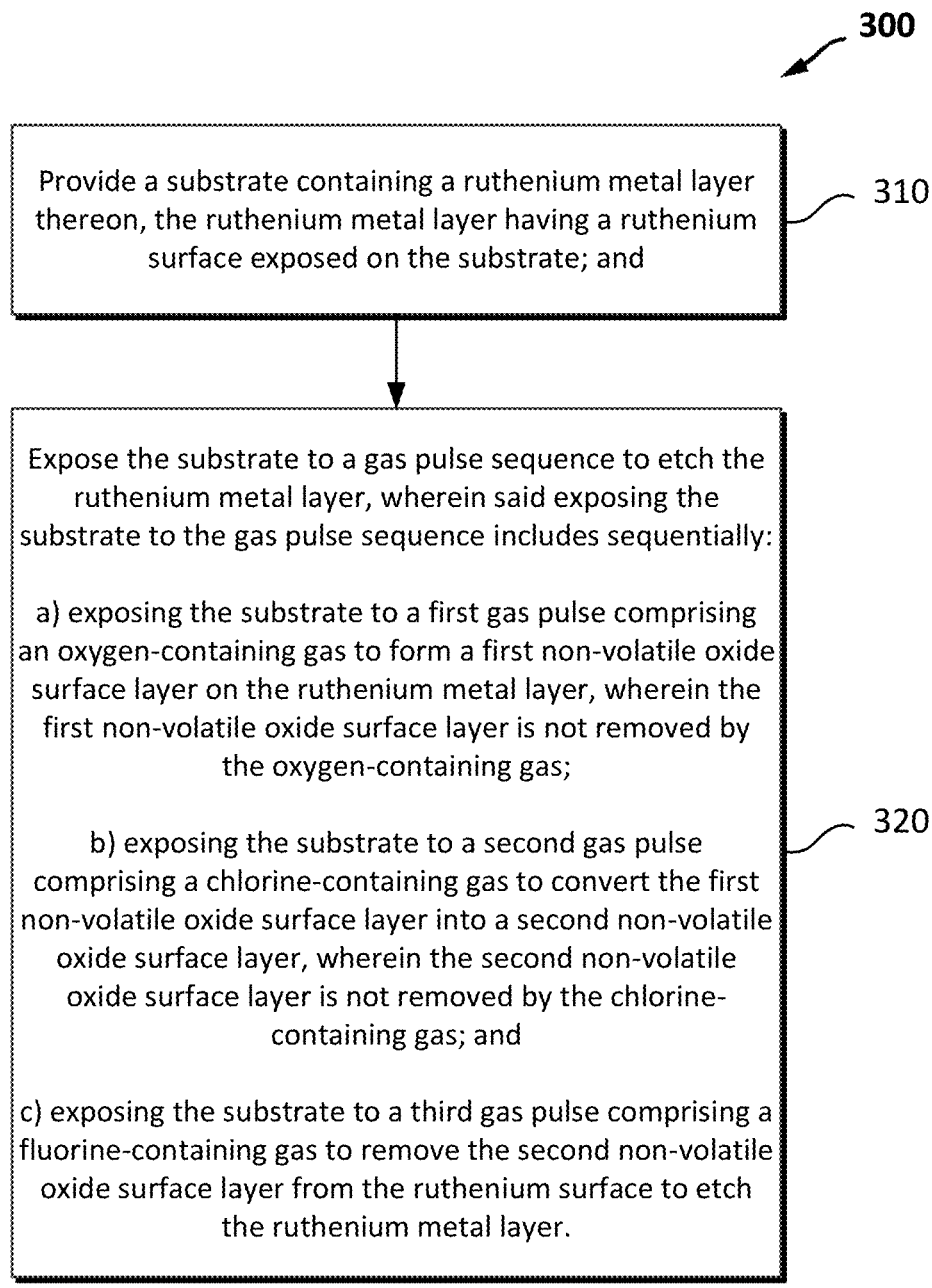
FIG. 3 is a flowchart diagram illustrating a method of etching according to a first embodiment of the present disclosure.

FIG. 3 illustrates one embodiment of a method 300 that uses the techniques disclosed herein to provide thermal dry etching of a ruthenium (Ru) metal layer. The method 300 shown in FIG. 3 begins by providing a substrate containing a ruthenium metal layer thereon (in step 310), where the ruthenium metal layer includes a ruthenium surface exposed on the substrate, and exposing the substrate to a gas pulse sequence to etch the ruthenium metal layer (in step 320). In some embodiments, the method 300 may repeat exposing the substrate to the gas pulse sequence (in step 320) at least once to achieve a predetermined etch amount of the ruthenium metal layer.

In the method 300 shown in FIG. 3, exposing the substrate to the gas pulse sequence (in step 320) includes sequentially: a) exposing the substrate to a first gas pulse comprising an oxygen-containing gas to form a first non-volatile oxide surface layer on the ruthenium metal layer, wherein the first non-volatile oxide surface layer is not removed by the oxygen-containing gas; b) exposing the substrate to a second gas pulse comprising a chlorine-containing gas to convert the first non-volatile oxide surface layer into a second non-volatile oxide surface layer, wherein the second non-volatile oxide surface layer is not removed by the chlorine-containing gas; and c) exposing the substrate to a third gas pulse comprising a fluorine-containing gas to remove the second non-volatile oxide surface layer from the ruthenium surface to etch the ruthenium metal layer.

A wide variety of oxygen-containing gases, chlorine-containing gases and fluorine-containing gases can be utilized within the gas pulse sequence, as noted above with regard to FIG. 2. For example, the oxygen-containing gas may be oxygen ($O_2$), ozone ($O_3$), water or hydrogen peroxide ($H_2O_2$), the chlorine-containing gas may be boron trichloride ($BCl_3$), chlorine ($Cl_2$), tungsten chloride ($WCl_5$), hydrochloric acid (HCl), trans-dichloroethylene ($C_2H_2Cl_2$), chlorine trifluoride ($ClF_3$) or titanium tetrachloride ($TiCl_4$), and the fluorine-containing gas may be hydrogen fluoride (HF), tungsten hexafluoride ($WF_6$), chlorine trifluoride ($ClF_3$), fluorine ($F_2$), xenon difluoride ($XeF_2$), boron trifluoride ($BF_3$), carbon tetrafluoride ($CF_4$), or nitrogen trifluoride ($NF_3$).

In some embodiments, the method 300 may expose the substrate to the gas pulse sequence (in step 320) while subjecting the substrate to relatively high temperatures. For example, the temperature of the substrate may range between about 160° C. and about 400° C., more preferably between about 200° C. and about 300° C., or between 225° C. and about 275° C. In one embodiment, the method 300 may expose the substrate to the gas pulse sequence (in step 320) while the substrate temperature is approximately 250° C. Other substrate temperatures above approximately 160° C. may also be utilized in the method 300.

In some embodiments, the steps a), b) and c) may be performed without plasma excitation, or at least without exposing the substrate to plasma. When ozone is utilized as the oxygen-containing gas in step a), the ozone may be formed in a remote plasma source and flowed to the substrate to avoid exposing the substrate to an oxygen plasma, which may damage the substrate surface.

Experiments were conducted on a test structure using a wide variety of etch chemistries to determine an optimal gas pulse sequence for etching a ruthenium metal layer. Results of the experiments are shown in FIGS. 5-7 and discussed in more detail below.

Process Examples for Etching a Ru Metal Layer Using Different Etch Chemistries

Figure 4:
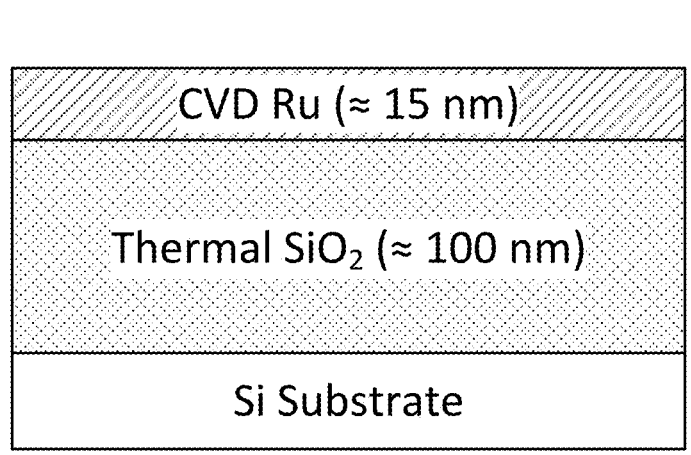
FIG. 4 is a cross-sectional view of an example test structure having a Ru metal layer formed thereon.

An example test structure 400 for thermal dry etching of a Ru metal layer is schematically shown in FIG. 4. The test structure 400 included a silicon (Si) substrate, a 100 nm thick silicon dioxide ($SiO_2$) layer on the Si substrate, and an approximately 15 nm thick Ru metal layer deposited by chemical vapor deposition (CVD) on the $SiO_2$ layer.

Etch experiments were conducted on the test structure 400 shown in FIG. 4. During the etch experiments, the test structure 400 was subjected to various gas pulse sequences containing different etch chemistries to etch the Ru metal layer, and the mean etch amount, post-etch surface roughness and film resistivity of the Ru metal layer were measured. The different etch chemistries utilized in the etch experiments included: $O_3$, $O_3/HF$, $O_3/BCl_3$, $O_3/BCl_3/HF$, and $BCl_3/HF$. In the etch experiments conducted herein, the notation $O_3/HF$ refers to sequential flows of an $O_3$ gas) for a first time period and a HF gas for a second time period, where there was no temporal overlap between the $O_3$ gas) flow and the HF gas flow. The sequential $O_3$ and HF gas flows were separated by an Ar purge gas flow. Similarly, the notation $O_3/BCl_3/HF$ refers to sequential flows of an $O_3$ gas) for a first time period, a $BCl_3$ gas for a second time period, and a HF gas for a third time period, where there was no temporal overlap between the $O_3$ gas) flow, the $BCl_3$ gas flow, and the HF gas flow. The sequential $O_3/BCl_3/HF$ gas flows were separated by an Ar purge gas flow as schematically shown in FIG. 2.

Figure 5A:
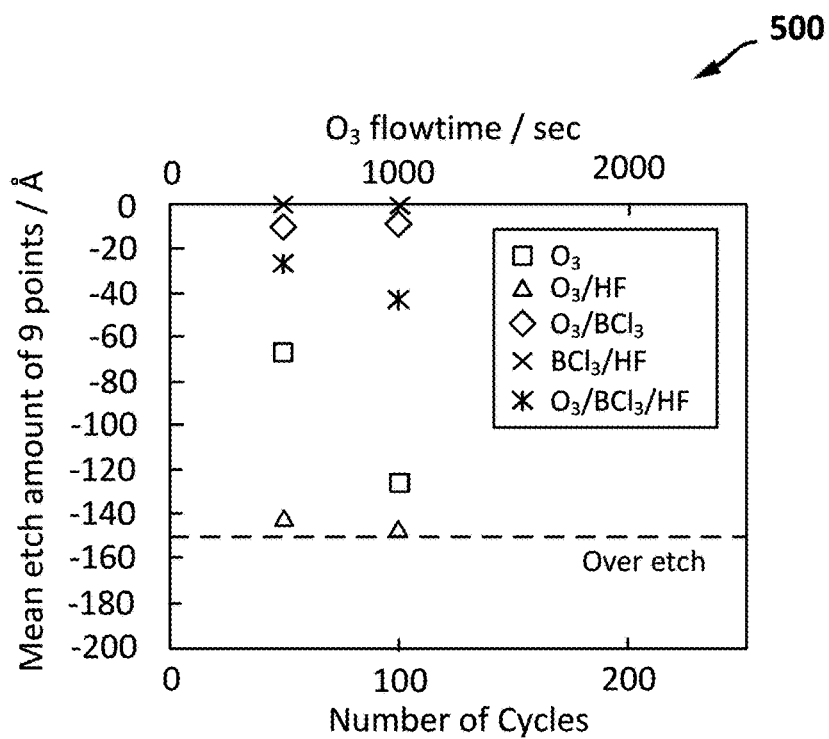
FIGS. 5A and 5B are graphs showing etching results for the test structure depicted in FIG. 4 using different etch chemistries.
Figure 5B:
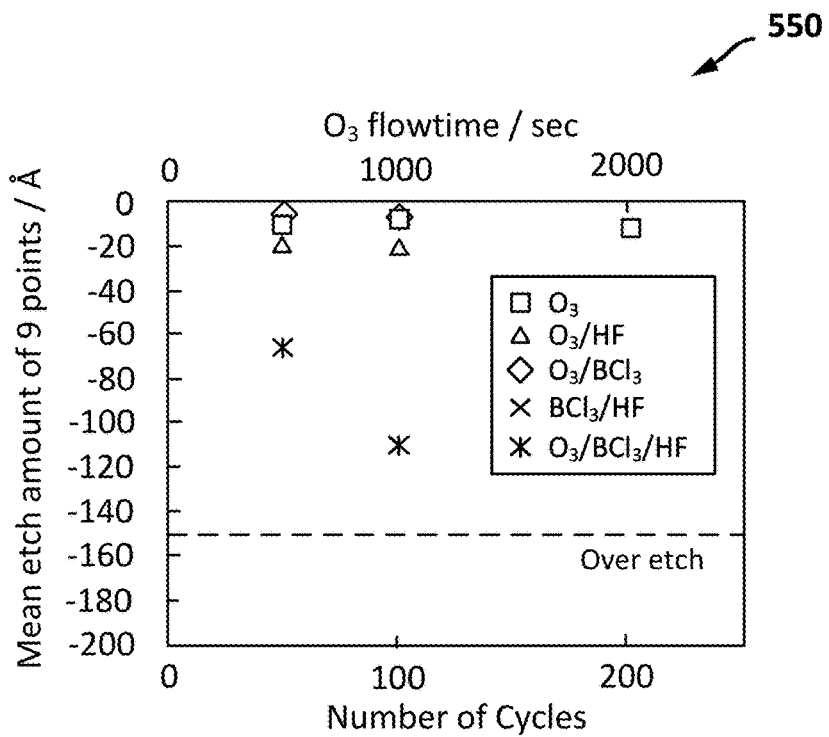

The graphs 500 and 550 shown in FIGS. 5A and 5B show etching results for the test structure 400 depicted in FIG. 4 using the different etch chemistries mentioned above. The amount of Ru metal that was etched by the etch chemistries is shown in FIGS. 5A and 5B as a function of the number of cycles, where each cycle includes a gas pulse sequence comprising one or more distinct gas pulses, and expressed as a mean etch amount using a standard 9 point sampling method. A negative mean etch amount refers to a thickness of Ru metal layer that was etched, and an over etch refers to fully removing the 15 nm Ru metal layer from the test structure 400. The substrate temperature was 120° C. in FIG. 5A and 250° C. in FIG. 5B. Further, the total $O_3$ flow times are shown in FIGS. 5A and 5B for the etch chemistries that contained $O_3$.

The graph 500 shown in FIG. 5A shows, that at a substrate temperature of 120° C., the $O_3$ and $O_3/HF$ etching chemistries etched the Ru metal layer at high etch rates (e.g., about 125 Å/100 cycles for $O_3$, and about 145 Å/100 cycles for $O_3/HF$), while the Ru metal layer was not significantly etched by the $BCl_3/HF$ and $O_3/BCl_3$ etch chemistries (e.g., about 0 Å/100 cycles for $BCl_3/HF$, and about 10 Å/100 cycles for $O_3/BCl_3$). In contrast, the $O_3/BCl_3/HF$ etching chemistry etched the Ru metal layer at a rate of about 45 Å/100 cycles.

The graph 550 shown in FIG. 5B shows, that at a substrate temperature of 250° C., the $O_3$, $O_3/HF$, $BCl_3/HF$, and $O_3/BCl_3$ etching chemistries did not significantly etch the Ru metal layer (e.g., about 5-10 Å/100 cycles for $O_3$, $BCl_3/HF$, and $O_3/BCl_3$, and about 20 Å/100 cycles for $O_3/HF$). In contrast, the $O_3/BCl_3/HF$ etching chemistry removed the Ru metal at a rate of about 110 Å/100 cycles.

The experimental results in FIGS. 5A and 5B show that $O_3$ etches a Ru metal layer at a high etch rate (e.g., about 125 Å/100 cycles) at a substrate temperature of 120° C., but the Ru metal is not significantly etched by $O_3$ at a substrate temperature of 250° C. This is likely due to the ruthenium dioxide ($RuO_2$) surface layer that is formed on the Ru surface when a Ru metal layer is exposed to $O_3$ gas) at relatively high substrate temperatures (e.g., temperatures above about 160° C., such as 250° C.). Because the $RuO_2$ surface layer is non-volatile and cannot be removed by $O_3$, etching of the Ru metal layer by $O_3$ ends as soon as $RuO_2$ forms on the Ru surface.

The experimental results in FIGS. 5A and 5B further show that the addition of $BCl_3$ to form a pulsed $O_3/BCl_3$ gas flow also stopped etching by $O_3$ at substrate temperatures of 120° C. and 250° C. When the Ru metal layer is exposed to a $BCl_3$ gas pulse after $O_3$ exposure, the $BCl_3$ gas reacts with the $RuO_2$ surface layer to form volatile ruthenium oxychloride ($RuO_xCl_y$) reaction products that are removed from the Ru surface and a boron oxide (e.g., boron trioxide, $B_2O_3$) surface layer on the Ru metal layer. Since the boron oxide surface layer is non-volatile and cannot be removed by $BCl_3$ or $O_3$, the pulsed $O_3/BCl_3$ gas flow did not significantly etch the Ru metal layer at substrate temperatures of 120° C. or 250° C.

In contrast to the pulsed $O_3$ and pulsed $O_3/BCl_3$ gas flows, the $O_3/BCl_3/HF$ etching chemistries etched the Ru metal layer at controllable etch rates at both 120° C. and 250° C. When HF was added to form a pulsed $O_3/BCl_3/HF$ gas flow, the HF gas pulse removed the boron oxide surface layer from the Ru surface to etch the Ru metal layer. Because HF gas does not react with Ru metal, the boron oxide surface layer is removed from the Ru surface without etching the unmodified Ru metal underlying the boron oxide surface layer. Repeating the $O_3/BCl_3/HF$ gas pulse sequence resulted in atomic layer etching of the Ru metal layer. Therefore, FIGS. 5A and 5B show that the $O_3/BCl_3/HF$ etching chemistry provides controllable etching of a Ru metal layer over the range of substrate temperatures that is suitable for semiconductor manufacturing.

Figure 6A:
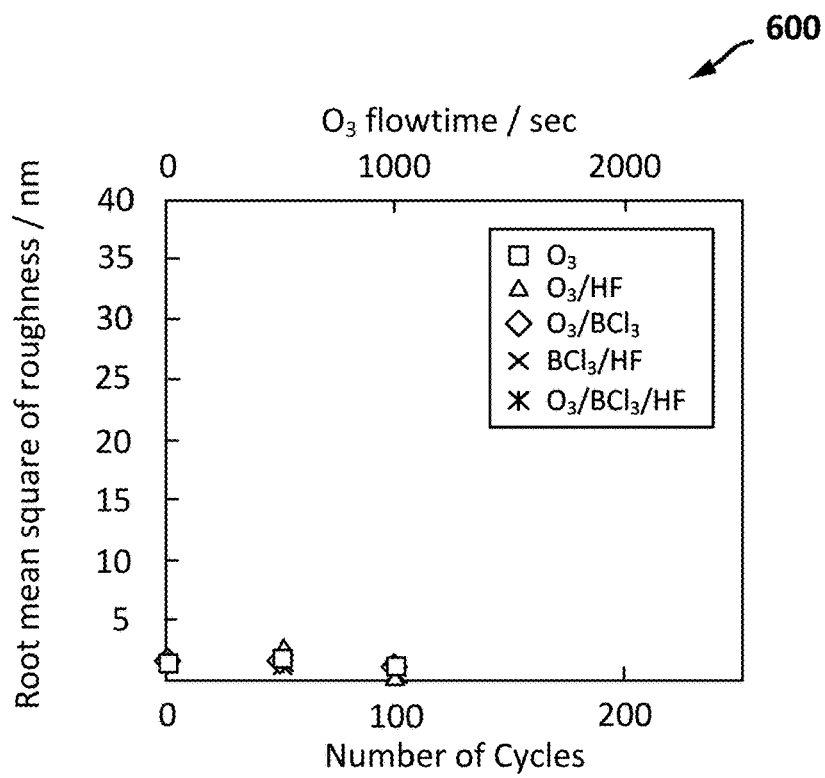
FIGS. 6A and 6B are graphs and illustrations showing post-etch surface roughness results for the test structure depicted in FIG. 4 using different etch chemistries.
Figure 6B:
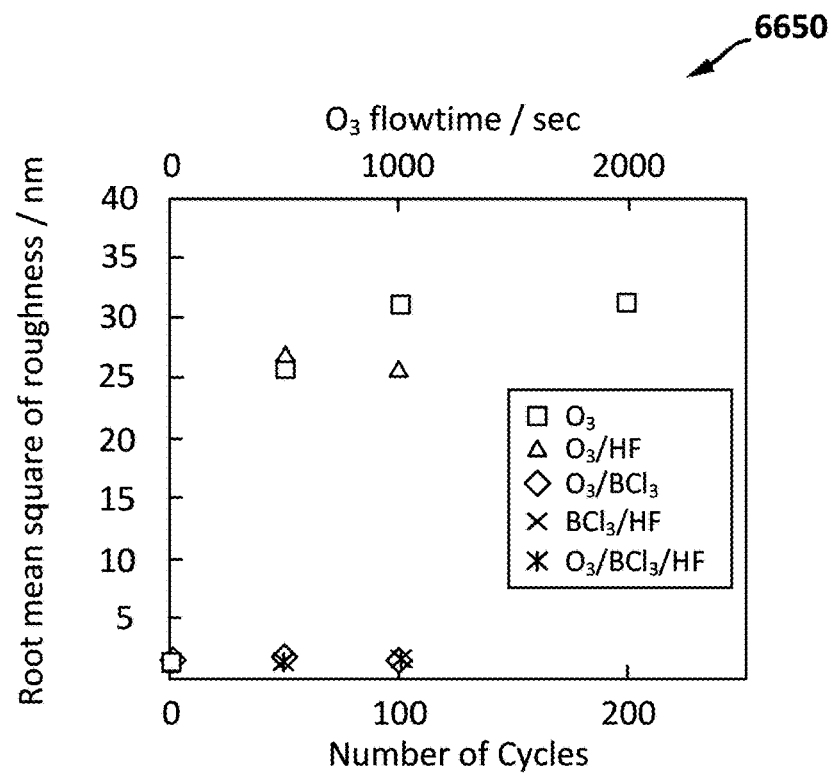

The graphs 600 and 650 shown in FIGS. 6A and 6B show post-etch surface roughness results for the test structure 400 depicted in FIG. 4 using the different etch chemistries mentioned above. The processing conditions were the same as described for FIGS. 5A and 5B.

The post-etch surface roughness is shown in FIGS. 6A-6B as root mean square of roughness as a function of the number of cycles used to etch the Ru metal layer. The substrate temperature was 120° C. in FIG. 6A and 250° C. in FIG. 6B. The graph 600 shown in FIG. 6A shows that all the different etching chemistries maintained low surface roughness throughout the etching process at a substrate temperature of 120° C. In contrast, the graph 650 shown in FIG. 6B shows that the $O_3$ and $O_3/HF$ etching chemistries resulted in high surface roughness, while the $O_3/BCl_3$, $O_3/BCl_3/HF$, and $BCl_3/HF$ etching chemistries resulted in low surface roughness, at a substrate temperature of 250° C. As shown in FIG. 5B and FIG. 6B, the $O_3/BCl_3/HF$ etching chemistry provides controllable etching of the Ru metal layer with low post-etch surface roughness at 250° C.

FIG. 6C provides Atomic Force Microscope (AFM) images showing surface roughness results for the test structure 400 in FIG. 4 when the test structure 400 is etched using the different etch chemistries mentioned above at a substrate temperature of 250° C. The AFM images shown in FIG. 6C include images of the as-deposited Ru metal layer, and after etching using $O_3$, $O_3/HF$, and $O_3/BCl_3/HF$ etching chemistries. The AFM images show that the as-deposited Ru metal layer had a low surface roughness (Rmax=8.9 nm, R average (Ra)=1.2 nm, and R root mean square (Rq)=1.5 nm). The dry etching processes resulted in considerable post-etch surface roughening when using the $O_3$ (Rmax=167.3 nm, Ra=25.8 nm, Rq=31.5 nm) and $O_3/HF$ (Rmax=158.4 nm, Ra=20.8 nm, Rq=26.3 nm) etching chemistries. However, use of the $O_3/BCl_3/HF$ etching chemistry did not result in significant post-etch surface roughening (Rmax=11.4 nm, Ra=1.4 nm, Rq=1.8 nm). Thus, the experimental results depicted in FIG. 6C show that etching a Ru metal film using the $O_3/BCl_3/HF$ etching chemistry produces a surface roughness, which is substantially identical to roughness of the as-deposited ruthenium film.

Figure 7A:
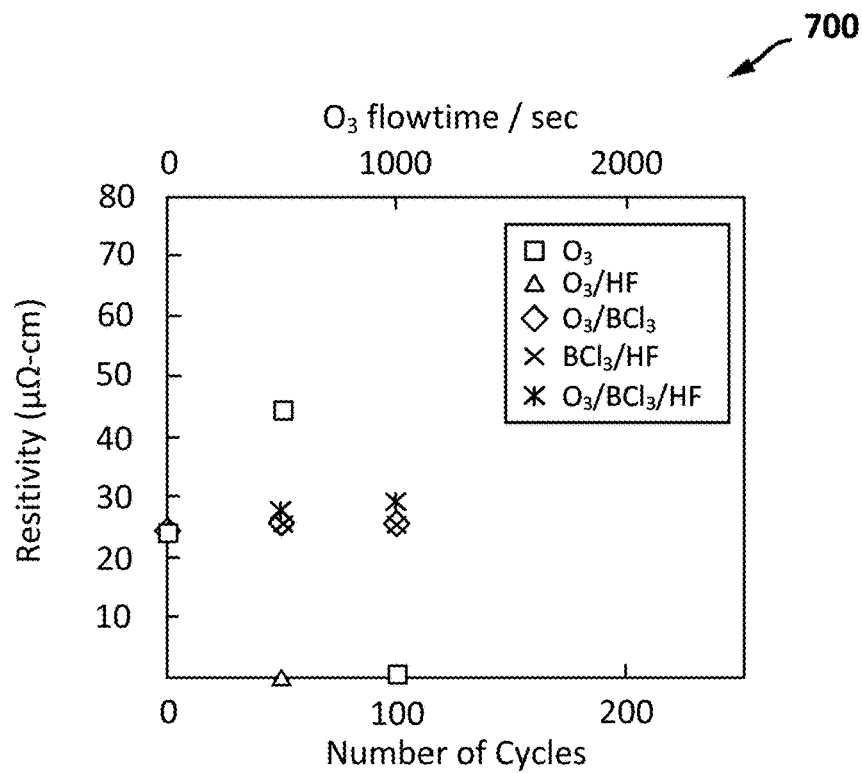
FIGS. 7A and 7B are graphs showing film resistivity results for the test structure in FIG. 4 using different etch chemistries.
Figure 7B:
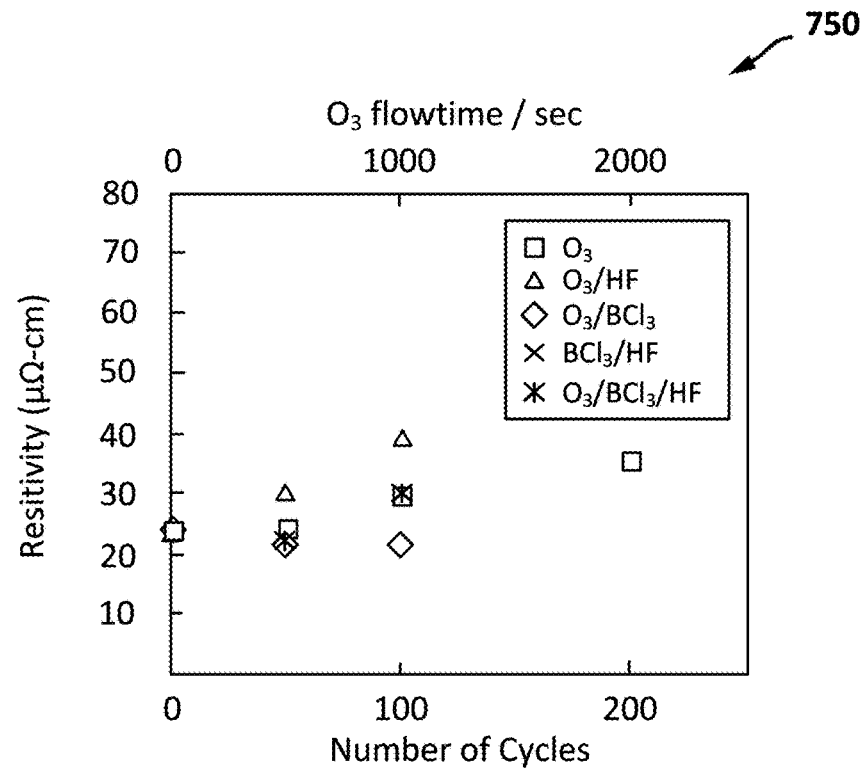

The graphs 700 and 750 shown in FIGS. 7A and 7B show film resistivity results for the test structure 400 in FIG. 4 using the different etch chemistries mentioned above. The processing conditions were the same as described for FIGS. 5A-5B and FIGS. 6A-6B. The substrate temperature was 120° C. in FIG. 7A and 250° C. in FIG. 7B. The as-deposited Ru metal layer had a film resistivity of about 24μΩ-cm. The experimental results shown in FIGS. 7A-7B show that the $O_3$ etching chemistry significantly increased the film resistivity at a substrate temperature of 120° C., but a smaller increase was measured at a substrate temperature of 250° C. where less etching was observed. In contrast, the $O_3/BCl_3/HF$ etching chemistry did not significantly increase the film resistivity at a substrate temperature of 120° C. or 250° C.

The dry etching results shown in FIGS. 5-7 may be summarized as follows:

At a substrate temperature of 120° C., etching chemistries containing $O_3$, $O_3$/HF, and $O_3$/$BCl_3$/HF etched the Ru metal layer at a high etch rate (e.g., about 125 Å/100 cycles for $O_3$, about 145 Å/100 cycles for $O_3$/HF and about 45 Å/100 cycles for $O_3$/$BCl_3$/HF) and the remaining Ru metal layer had low surface roughness and low electrical resistivity.

At a substrate temperature of 250° C., however, the etching chemistries containing $O_3$ and $O_3$/HF did not significantly etch the Ru metal layer, due to the $RuO_2$ surface layer formed on the Ru metal layer by the $O_3$ exposure that prevented further etching of the Ru metal layer. The $RuO_2$ layer formed on the Ru metal layer was removed by the $O_3$/$BCl_3$/HF etching chemistry, but $O_3$, $O_3$/HF, and $O_3$/$BCl_3$ etching chemistries could not remove the $RuO_2$ layer and etching of the Ru metal layer stopped.

Figure 8:
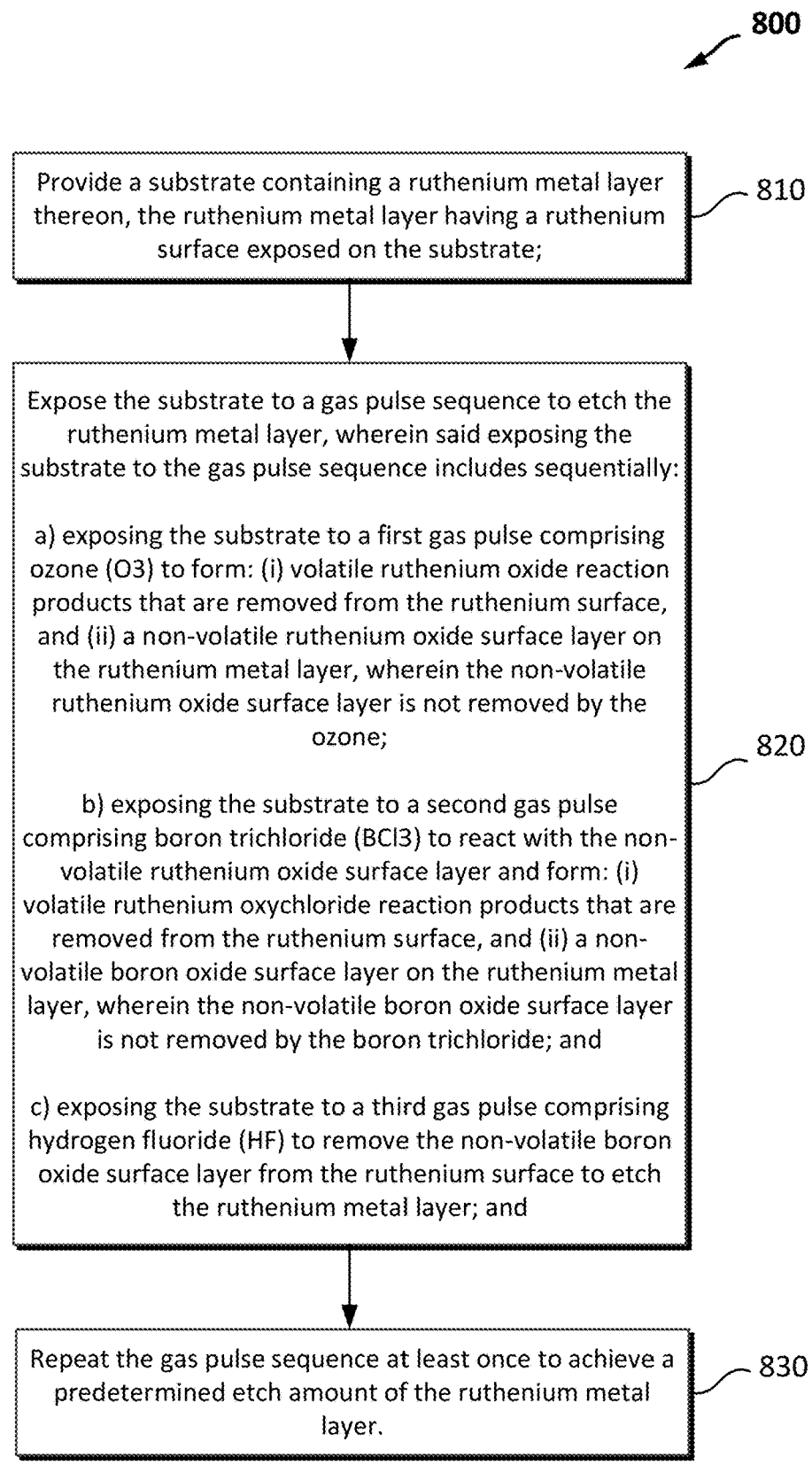
FIG. 8 is a flowchart diagram illustrating a method of etching according to a second embodiment of the present disclosure.
Figure 9:
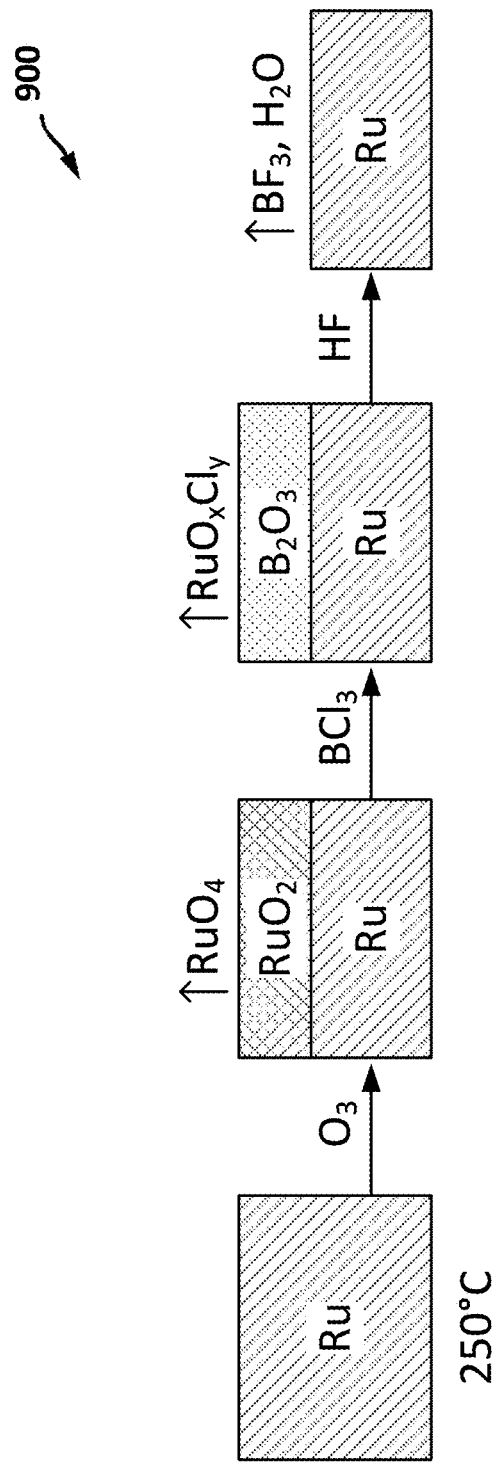
FIG. 9 schematically shows a process flow for etching a Ru metal layer in accordance with the method shown in FIG. 8.

FIGS. 8 and 9 illustrate a method 800 and process flow 900, respectively, for etching a Ru metal layer according to another embodiment of the invention. The method 800 includes providing a substrate containing a ruthenium metal layer thereon (in step 810), the ruthenium metal layer having a ruthenium surface exposed on the substrate, exposing the substrate to a gas pulse sequence to etch the ruthenium metal layer (in step 820) and repeating the gas pulse sequence at least once to achieve a predetermined etch amount of the ruthenium metal layer (in step 830).

In the method 800 shown in FIG. 8, exposing the substrate to the gas pulse sequence (in step 820) includes sequentially: a) exposing the substrate to a first gas pulse comprising ozone ($O_3$) to form: (i) volatile ruthenium oxide ($RuO_4$) reaction products that are removed from the ruthenium surface, and (ii) a non-volatile ruthenium oxide ($RuO_2$) surface layer on the ruthenium metal layer, wherein the non-volatile ruthenium oxide ($RuO_2$) surface layer is not removed by the ozone; b) exposing the substrate to a second gas pulse comprising boron trichloride ($BCl_3$) to react with the ruthenium oxide ($RuO_2$) surface layer and form: (i) volatile ruthenium oxychloride ($RuO_xCl_y$) reaction products that are removed from the ruthenium surface, and (ii) a non-volatile boron oxide (e.g., boron trioxide, $B_2O_3$) surface layer on the ruthenium metal layer, wherein the non-volatile boron oxide surface layer is not removed by the boron trichloride; and c) exposing the substrate to a third gas pulse comprising hydrogen fluoride (HF) to remove the non-volatile boron oxide (e.g., $B_2O_3$) surface layer from the ruthenium surface to etch the ruthenium metal layer.

In some embodiments, the method 800 may expose the substrate to the gas pulse sequence (in step 820) while subjecting the substrate to relatively high temperatures. For example, the temperature of the substrate may range between about 160° C. and about 400° C., more preferably between about 200° C. and about 300° C., or between 225° C. and about 275° C. In one embodiment, the method 800 may expose the substrate to the gas pulse sequence (in step 820) while the substrate temperature is approximately 250° C. Other substrate temperatures above approximately 160° C. may also be utilized in the method 800.

In some embodiments, the steps b) and c) may be performed without plasma excitation. When exposing the substrate to ozone in step a), the ozone may be formed in a remote plasma source and flowed to the substrate to avoid exposing the substrate to an oxygen plasma, which may damage the substrate surface.

FIG. 9 depicts a process flow 900 for etching a Ru metal layer in accordance with the method 800 shown in FIG. 8. As shown in FIG. 9, exposing the substrate to an ozone ($O_3$) gas pulse at relatively high substrate temperatures (e.g., about 250° C.) forms volatile ruthenium tetroxide ($RuO_4$) reaction products that are removed from the ruthenium surface and a non-volatile ruthenium dioxide ($RuO_2$) surface layer on the Ru metal layer. Because the $RuO_2$ surface layer is non-volatile and cannot be removed by $O_3$, etching of the Ru metal layer by $O_3$ stops as soon as $RuO_2$ forms on the Ru surface.

After exposure to the $O_3$ gas) pulse (and an optional purge gas), the substrate is exposed to a boron trichloride ($BCl_3$) gas pulse. It is contemplated that the $BCl_3$ exposure reacts with the $RuO_2$ surface layer to form volatile ruthenium oxychloride ($RuO_xCl_y$) reaction products that are removed from the Ru surface in addition to a nonvolatile boron oxide (e.g., boron trioxide, $B_2O_3$) surface layer, which cannot be removed by either $O_3$ or $BCl_3$.

After exposure to the $BCl_3$ gas pulse (and an optional purge gas), the substrate is exposed to a hydrogen fluoride (HF) gas pulse. It is contemplated that the HF exposure forms volatile $BF_3$ and $H_2O$ reaction products when reacting with the boron oxide surface layer, thereby removing the boron oxide surface layer and forming a new Ru metal layer surface. After another optional purge gas exposure, the $O_3$/$BCl_3$/HF gas pulse sequence shown in FIG. 9 may be repeated at least once to achieve a predetermined etch amount of the Ru metal layer.

According to another embodiment of the invention, a substrate may contain an exposed Ru metal surface and an exposed $RuO_2$ surface. Sequential $BCl_3$ and HF exposures may be used to selectively etch the $RuO_2$ surface relative to the Ru metal surface.

Figure 10:
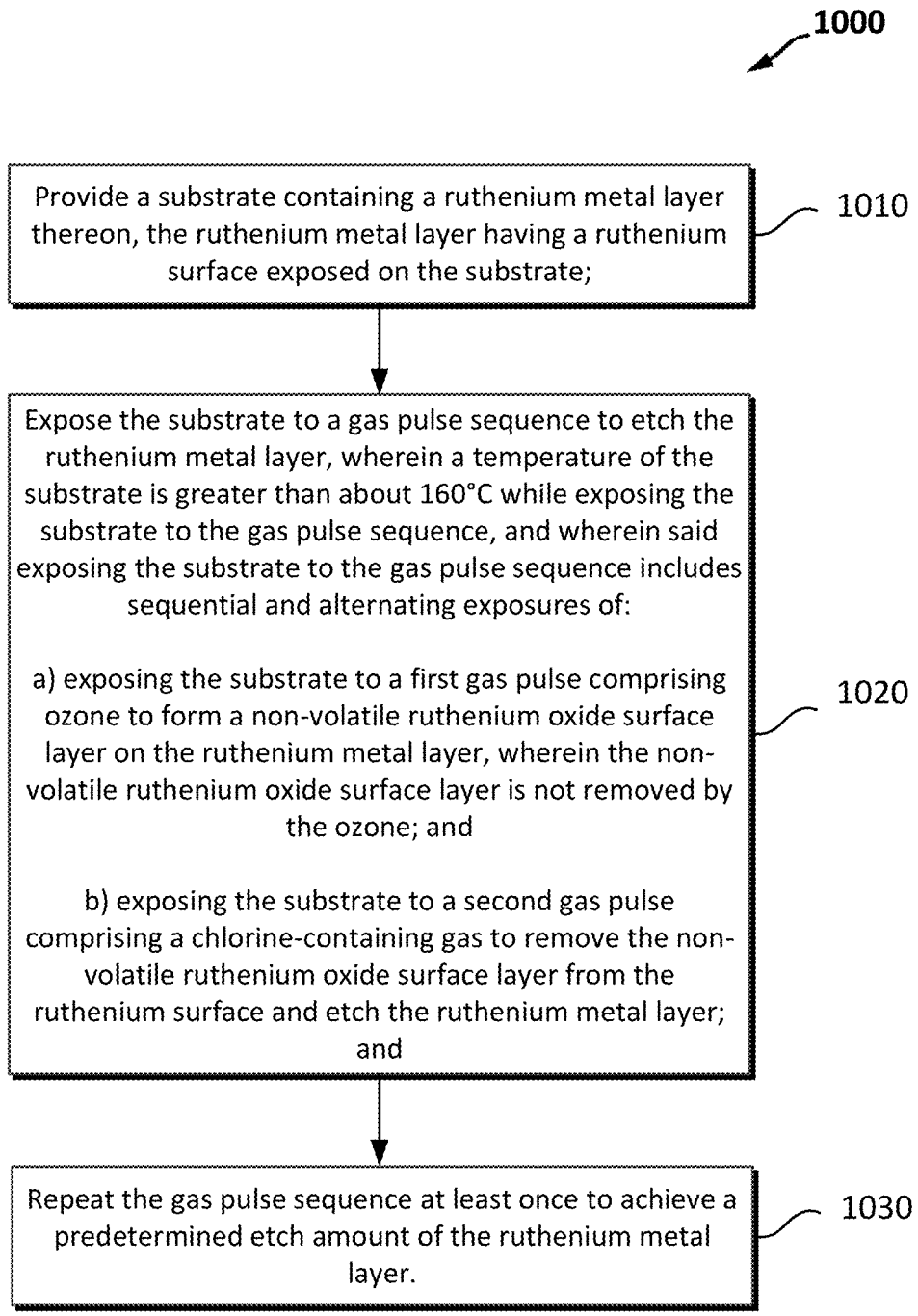
FIG. 10 is a flowchart diagram illustrating a method of etching according to a third embodiment of the present disclosure.
Figure 11:
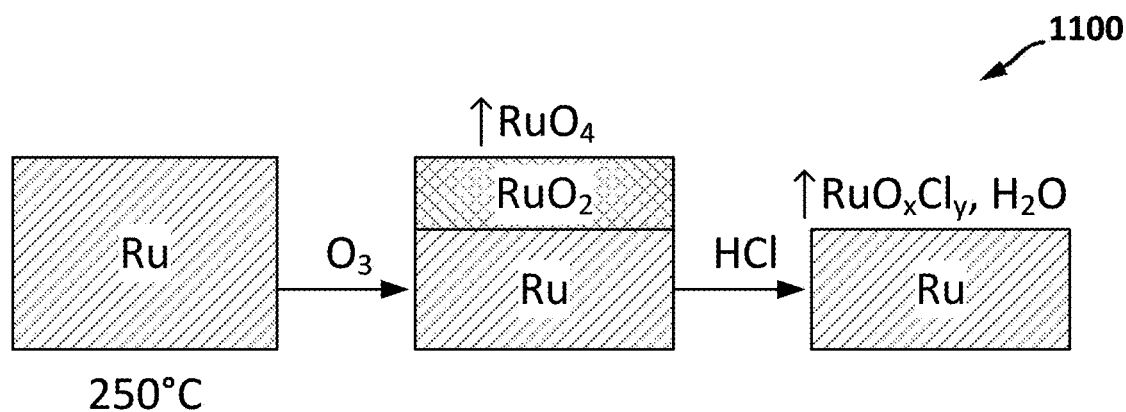
FIG. 11 schematically shows a process flow for etching a Ru metal layer in accordance with the method shown in FIG. 10.

FIGS. 10 and 11 illustrate another method 1000 and process flow 1100, respectively, for etching a Ru metal layer according to yet another embodiment of the invention. The method 1000 includes providing a substrate containing a ruthenium metal layer thereon (in step 1010), the ruthenium metal layer having a ruthenium surface exposed on the substrate, and exposing the substrate to a gas pulse sequence to etch the ruthenium metal layer (in step 1020), wherein a temperature of the substrate is greater than about 160° C. while exposing the substrate to the gas pulse sequence, and repeating the gas pulse sequence at least once to achieve a predetermined etch amount of the ruthenium metal layer (in step 1030).

In the method 1000 shown in FIG. 10, exposing the substrate to the gas pulse sequence (in step 1020) includes sequential and alternating exposures of: a) exposing the substrate to a first gas pulse comprising ozone to form a non-volatile ruthenium oxide ($RuO_2$) surface layer on the ruthenium metal layer, wherein the non-volatile ruthenium oxide ($RuO_2$) surface layer is not removed by the ozone; and b) exposing the substrate to a second gas pulse comprising a chlorine-containing gas to remove the non-volatile ruthenium oxide ($RuO_2$) surface layer from the ruthenium surface and etch the ruthenium metal layer.

In the method 1000 shown in FIG. 10, the chlorine-containing gas used in step b) may further include hydrogen. For example, the chlorine-containing gas may be hydrogen chloride (HCl), chloroform ($CHCl_3$), chloromethane ($CH_3Cl$), dichloromethane ($CH_2Cl_2$) or trichloroethylene ($C_2HCl_3$). When the substrate is exposed to a second gas pulse containing chlorine and hydrogen gases, the chlorine and hydrogen gases react with the ruthenium oxide ($RuO_2$) surface layer to form volatile reaction products that are vaporized from the ruthenium surface to remove the ruthenium oxide ($RuO_2$) surface layer and etch the Ru metal layer.

In some embodiments, the method 1000 may expose the substrate to the gas pulse sequence (in step 1020) while subjecting the substrate to relatively high temperatures. For example, the temperature of the substrate may range between about 160° C. and about 400° C., or more preferably between about 200° C. and about 300° C., or between 225° C. and about 275° C. In one embodiment, the method 1000 may expose the substrate to the gas pulse sequence (in step 1020) while the substrate temperature is approximately 250° C. Other substrate temperatures above approximately 160° C. may also be utilized in the method 1000.

In some embodiments, the step b) may be performed without plasma excitation. When exposing the substrate to ozone in step a), the ozone may be formed in a remote plasma source and flowed to the substrate to avoid exposing the substrate to an oxygen plasma, which may damage the substrate surface.

FIG. 11 depicts a process flow 1100 for etching a Ru metal layer in accordance with the method 1000 shown in FIG. 10. As shown in FIG. 11, exposing the substrate to an ozone ($O_3$) gas pulse at relatively high substrate temperatures (e.g., about 250° C.) forms volatile ruthenium tetroxide ($RuO_4$) reaction products that are removed from the ruthenium surface and a non-volatile ruthenium dioxide ($RuO_2$) surface layer on the Ru metal layer. Because the $RuO_2$ surface layer is non-volatile and cannot be removed by $O_3$, etching of the Ru metal layer by $O_3$ stops as soon as $RuO_2$ forms on the Ru surface.

After exposure to the $O_3$ gas) pulse (and an optional purge gas), the substrate is exposed to a hydrogen chloride (HCl) gas pulse. It is contemplated that the HCl exposure reacts with the $RuO_2$ surface layer to form volatile ruthenium oxychloride ($RuO_xCl_y$) and water ($H_2O$) reaction products, which remove the $RuO_2$ surface layer to uncover a new Ru metal layer surface. After another optional purge gas exposure, the $O_3$/HCl gas pulse sequence shown in FIG. 11 may be repeated at least once to achieve a predetermined etch amount of the Ru metal layer.

The present disclosure provides various embodiments of improved process flows and methods for thermal dry etching of a Ru metal layer at a controllable etch rate by utilizing a gas pulse sequence of etch gases that provide self-limiting etch behavior during each gas pulse exposure. The gas pulse sequence may include two or three etch gases, which are supplied to the substrate sequentially with substantially no overlap between gas pulses. The gas pulses supplied to the substrate form: (i) volatile reaction products (etch by-products) that are vaporized from the Ru surface, and (ii) non-volatile oxide surface layers that are removed from the Ru surface by the next gas pulse, resulting in atomic layer etching (ALE) of the Ru metal layer. In some embodiments, purge gas pulses may be supplied to the substrate between each etch gas pulse to prevent the etch gases from mixing in the process chamber.

The disclosed embodiments improve upon conventional process flows and methods by providing a thermal dry etching process for etching a Ru metal layer, wherein the thermal dry etching process is controllable at the atomic-scale and selective to other materials. The thermal dry etching process described herein can be performed within the same process chamber (e.g., a chemical vapor etching (CVE) process chamber) without exposing the substrate to plasma. In addition to a controllable etch process, the thermal dry etching methods disclosed herein provide a smooth etched surface of the Ru metal layer while maintaining low resistivity.

The term "semiconductor substrate" or "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:
providing a substrate containing a ruthenium metal layer thereon, the ruthenium metal layer having a ruthenium surface exposed on the substrate; and
exposing the substrate to a gas pulse sequence to etch the ruthenium metal layer, wherein said exposing the substrate to the gas pulse sequence includes:
  a) exposing the substrate to a first gas pulse comprising an oxygen-containing gas to form a first non-volatile oxide surface layer on the ruthenium metal layer, wherein the first non-volatile oxide surface layer is not removed by the oxygen-containing gas;
  b) exposing the substrate to a second gas pulse comprising a chlorine-containing gas to convert the first non-volatile oxide surface layer into a second non-volatile oxide surface layer, wherein the second non-volatile oxide surface layer is not removed by the chlorine-containing gas; and
  c) exposing the substrate to a third gas pulse comprising a fluorine-containing gas to remove the second non-volatile oxide surface layer from the ruthenium surface to etch the ruthenium metal layer.

2. The method of claim 1, further comprising repeating said exposing the substrate to the gas pulse sequence at least once to achieve a predetermined etch amount of the ruthenium metal layer.

3. The method of claim 1, wherein steps b) and c) are performed without plasma excitation.

4. The method of claim 1, wherein the oxygen-containing gas comprises ozone ($O_3$), and wherein step a) further includes:
forming the ozone in a remote plasma source, and
flowing the ozone to the substrate.

5. The method of claim 1, wherein a temperature of the substrate is between about 160° C. and about 400° C. during said exposing the substrate to the gas pulse sequence.

6. The method of claim 1, wherein the oxygen-containing gas comprises oxygen ($O_2$), ozone ($O_3$), water or hydrogen peroxide ($H_2O_2$).

7. The method of claim 1, wherein the chlorine-containing gas comprises boron trichloride ($BCl_3$), chlorine ($Cl_2$), tungsten chloride ($WCl_5$), hydrochloric acid (HCl), trans-dichloroethylene ($C_2H_2Cl_2$), chlorine trifluoride ($ClF_3$) or titanium tetrachloride ($TiCl_4$).

8. The method of claim 1, wherein the fluorine-containing gas comprises hydrogen fluoride (HF), tungsten hexafluoride ($WF_6$), chlorine trifluoride ($ClF_3$), fluorine ($F_2$), xenon difluoride ($XeF_2$), boron trifluoride ($BF_3$), carbon tetrafluoride ($CF_4$), or nitrogen trifluoride ($NF_3$).

9. The method of claim 1, wherein the oxygen-containing gas comprises ozone ($O_3$), wherein the chlorine-containing gas comprises boron trichloride ($BCl_3$), and wherein the fluorine-containing gas comprises hydrogen fluoride (HF).

10. The method of claim 9, wherein:
  a) exposing the substrate to the first gas pulse comprising ozone ($O_3$) forms a ruthenium oxide surface layer on the ruthenium metal layer, wherein the ruthenium oxide surface layer is non-volatile and not removed by the ozone;
  b) exposing the substrate to the second gas pulse comprising boron trichloride ($BCl_3$) forms a boron oxide surface layer on the ruthenium metal layer, wherein the boron oxide surface layer is non-volatile and not removed by the boron trichloride; and
  c) exposing the substrate to the third gas pulse comprising hydrogen fluoride (HF) removes the boron oxide surface layer from the ruthenium surface without etching the ruthenium metal layer underlying the boron oxide surface layer.

11. A method of etching, the method comprising:
providing a substrate containing a ruthenium metal layer thereon, the ruthenium metal layer having a ruthenium surface exposed on the substrate;
exposing the substrate to a gas pulse sequence to etch the ruthenium metal layer, wherein said exposing the substrate to the gas pulse sequence includes sequentially:
  a) exposing the substrate to a first gas pulse comprising ozone ($O_3$) to form: (i) volatile ruthenium oxide reaction products that are removed from the ruthenium surface, and (ii) a non-volatile ruthenium oxide surface layer on the ruthenium metal layer, wherein the non-volatile ruthenium oxide surface layer is not removed by the ozone;
  b) exposing the substrate to a second gas pulse comprising boron trichloride ($BCl_3$) to react with the non-volatile ruthenium oxide surface layer and form: (i) volatile ruthenium oxychloride reaction products that are removed from the ruthenium surface, and (ii) a non-volatile boron oxide surface layer on the ruthenium metal layer, wherein the non-volatile boron oxide surface layer is not removed by the boron trichloride; and
  c) exposing the substrate to a third gas pulse comprising hydrogen fluoride (HF) to remove the non-volatile boron oxide surface layer from the ruthenium surface to etch the ruthenium metal layer; and
repeating the gas pulse sequence at least once to achieve a predetermined etch amount of the ruthenium metal layer.

12. The method of claim 11, wherein a temperature of the substrate is between about 160° C. and about 400° C. during said exposing the substrate to the gas pulse sequence.

13. The method of claim 11, wherein step a) further includes:
forming the ozone in a remote plasma source, and
flowing the ozone to the substrate.

14. The method of claim 11, wherein steps b) and c) are performed without plasma excitation.

15. A method of etching, the method comprising:
providing a substrate containing a ruthenium metal layer thereon, the ruthenium metal layer having a ruthenium surface exposed on the substrate;
exposing the substrate to a gas pulse sequence to etch the ruthenium metal layer, wherein a temperature of the substrate is greater than about 160° C. while exposing the substrate to the gas pulse sequence, and wherein said exposing the substrate to the gas pulse sequence includes sequential and alternating exposures of:
  a) exposing the substrate to a first gas pulse comprising ozone to form a non-volatile ruthenium oxide surface layer on the ruthenium metal layer, wherein the non-volatile ruthenium oxide surface layer is not removed by the ozone; and b) exposing the substrate to a second gas pulse comprising a chlorine-containing gas to remove the non-volatile ruthenium oxide surface layer from the ruthenium surface and etch the ruthenium metal layer; and repeating the gas pulse sequence at least once to achieve a predetermined etch amount of the ruthenium metal layer.

16. The method of claim 15, wherein step b) is performed without plasma excitation.

17. The method of claim 15, wherein step a) further includes:

forming the ozone in a remote plasma source, and flowing the ozone to the substrate.

18. The method of claim 15, wherein the temperature of the substrate is between about 160° C. and about 400° C.

19. The method of claim 15, wherein the chlorine-containing gas further comprises hydrogen.

20. The method of claim 19, wherein the chlorine-containing gas is hydrogen chloride (HCl), chloroform ($CHCl_3$), chloromethane ($CH_3Cl$), dichloromethane ($CH_2Cl_2$) or trichloroethylene ($C_2HCl_3$).

* * * * *